ND GATE # United States Patent [19]

Kaszubinski et al.

[11] Patent Number: 4,740,925
[45] Date of Patent: Apr. 26, 1988

[54] EXTRA ROW FOR TESTING PROGRAMMABILITY AND SPEED OF ROMS

[75] Inventors: Jeffrey K. Kaszubinski, Houston; David D. Wilmoth; Timmie M. Coffman, both of Sugarland; John F. Schreck, Houston, all of Tex.

[73] Assignee: Texas Instruments Incorporated, Dallas, Tex.

[21] Appl. No.: 786,992

[22] Filed: Oct. 15, 1985

[51] Int. Cl.⁴ ............................................. G11C 7/00
[52] U.S. Cl. .................................... 365/200; 365/201
[58] Field of Search ....................... 365/200, 201, 210; 371/10, 11, 21; 324/73 R

[56] References Cited

U.S. PATENT DOCUMENTS

| | | | |
|---|---|---|---|
| 4,358,833 | 11/1982 | Folmsbee et al. | 365/200 |
| 4,365,319 | 12/1982 | Takemae | 365/200 |
| 4,571,707 | 2/1986 | Watanabe | 365/200 |
| 4,639,897 | 1/1987 | Wacyk | 365/200 |

*Primary Examiner*—Joseph A. Popek
*Attorney, Agent, or Firm*—John G. Graham; Rodney M. Anderson

[57] ABSTRACT

A method of making an array of programmable read only semiconductor memory cells which includes forming an extra row of the memory cells and a corresponding extra row gate coupled thereto. Extra row gate enabling means is coupled to the extra row gate for enabling the extra row gate in response to a control signal KILLT applied thereto. A disabling means is coupled to a first selected row gate other than the extra row gate in order to disable the selected row gate in response to a control signal KILLT applied thereto. A disabling means is coupled to a first selected row gate other than the extra row gate in order to disable the selected row gate in response to the control signal KILLT being applied thereto.

An NAND gate may be formed with the extra row gate to allow a second set of signals corresponding to a second selected row of memory cells to enable the second selected row gate. A disabling means is coupled to the second selected-row gate other than the extra row gate. In response to a control signal KILLB being applied to both the NAND gate and to the gate of the second selected row, it is possible to use the second selected row to test the first selected row and vice versa.

10 Claims, 1 Drawing Sheet

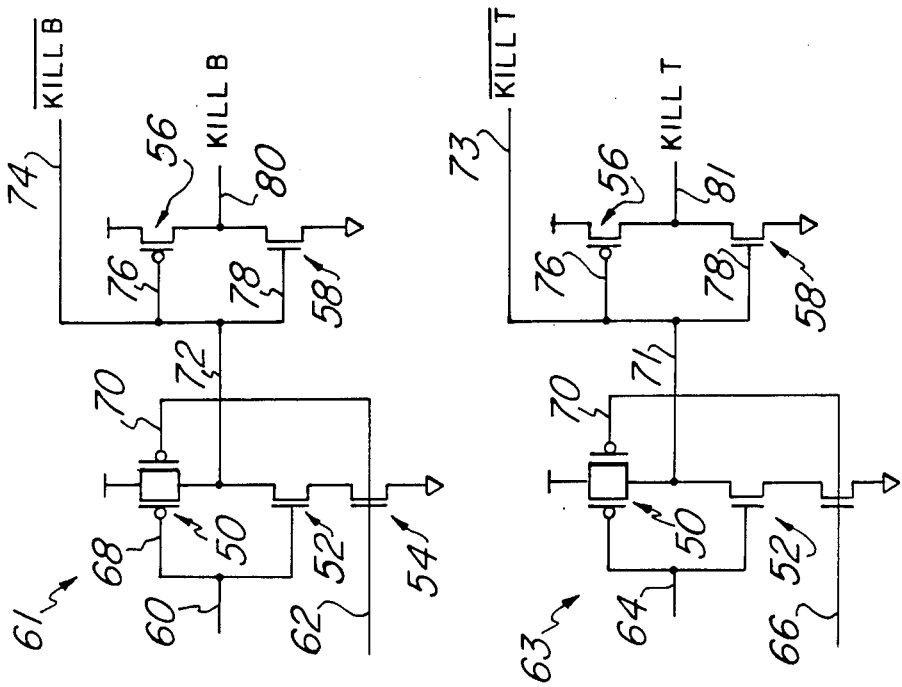
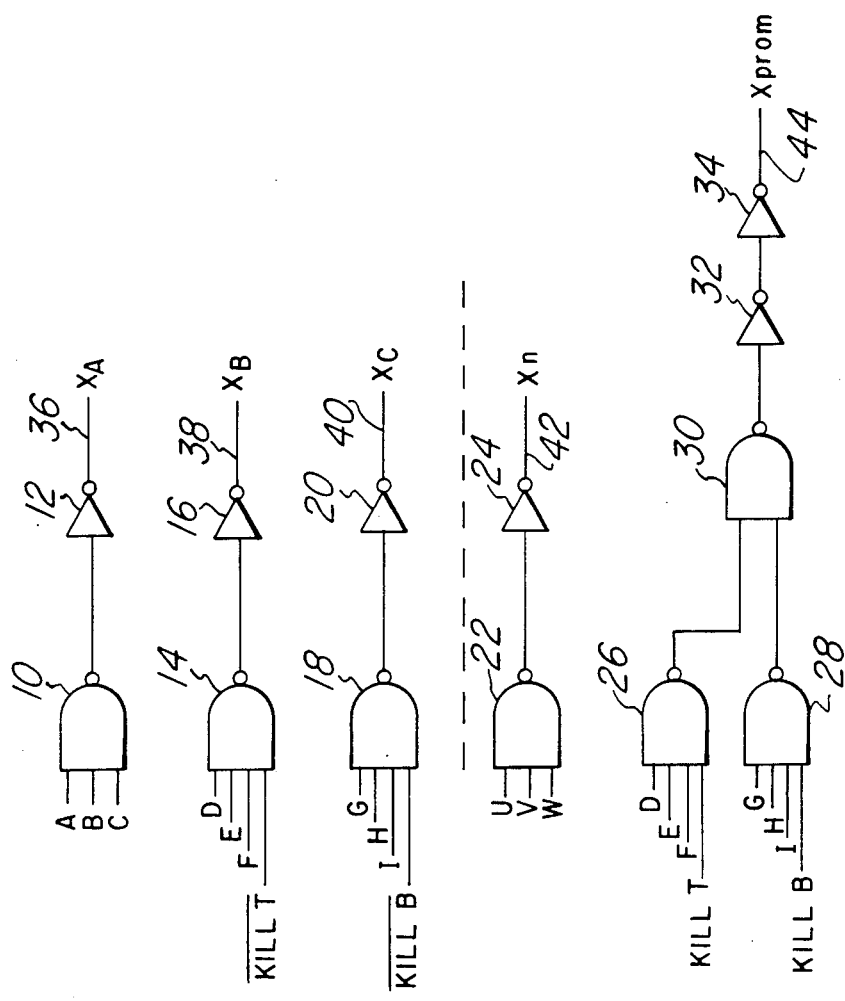
Fig. 2
Fig. 1

EXTRA ROW FOR TESTING PROGRAMMABILITY AND SPEED OF ROMS

BACKGROUND OF THE INVENTION

The present invention relates to a method of providing for the testing of programmability and speed of one time programmable read only semiconductor memory cells.

In the past, electrically programmable read only memory cells have been put into packages with light transmitting windows in order to permit them to be erased by exposure to a relatively intense source of ultra violet light. As a part of the normal testing procedure for such devices a pattern is programmed in to verify programming functionality and then a speed check is performed. Next, the part is stamped with the correct speed, erased by ultra violet light and then shipped to the customer. Due to the expense of providing a package for these chips with a transparent window more and more of such EPROMS are being packaged without windows as one time programmable PROMS (Programmable Read-Only-Memories). Such devices can ordinarily not be tested prior to shipment to a customer because once programmed they can not be erased by ultra violet light.

Accordingly, a principal object of this invention is to provide a method of testing arrays of one-time programmable read only semiconductor memory cells after being packaged.

SUMMARY OF THE INVENTION

According to the invention there is provided a method of making an array of programmable read only semiconductor memory cells which includes forming an extra row of the memory cells and a corresponding extra row gate coupled thereto. Extra row gate enabling means is coupled to the extra row gate for enabling the extra row gate in response to a control signal KILLT applied thereto. A disabling means is coupled to a first selected row gate other than the extra row gate in order to disable the selected row gate in response to a control signal KILLT applied thereto. A disabling means is coupled to a first selected row gate other than the extra row gate in order to disable the selected row gate in response to the control signal KILLT being applied thereto.

An NAND gate may be formed with the extra row gate to allow a second set of signals corresponding to a second selected row of memory cells to enable the second selected row gate. A disabling means is coupled to the second selected row gate other than the extra row gate. In response to a control signal KILLB being applied to both the NAND gate and to the gate of the second selected row, it is possible to use the second selected row to test the first selected row and vice versa.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a block diagram of the logic circuitry for disabling two rows of the array and enabling the extra row; and FIG. 2 is a circuit diagram of the enabling signal generator.

DETAILED DESCRIPTION WITH REFERENCE TO THE DRAWINGS

Referring to FIG. 1, the decoding arrangement for a typical array of cells consists of an AND logic element coupled to each row line. In FIG. 1 there are shown to be "n" rows having an unspecified number of cells in each row. Each AND element is made up of a NAND gate 10, 14, 18, ... 22 coupled to corresponding inverters 12, 16, 20, ... 24, respectively. The outputs of inverters 12, 16, 20, ... and 24 are connected to row lines 36, 38, 40, ..., and 42, respectively. To the inputs of NAND gates 10, 14, 18, ..., and 24 are fed input signal lines [A, B, C], [D, E, F], ..., and [U, V, W], respectively. Normally a particular row line is selected by application of the indicated combination of input signals. For example, to select row line 36, "1" signals must appear on signal lines A, B, and C simultaneously. Once row 36 is selected any cell in that row can either be programmed with a "0" or simply read.

In order to allow testing of the cells for access time and to test the programming circuitry without programming the cells irreversibly, an extra row 44 of cells is formed on the semiconductor face. NAND gates 14 and 18 on two selected rows are provided with respective enable inputs $\overline{\text{KILLT}}$ and $\overline{\text{KILLB}}$. To the extra row 44 there is coupled an OR gate made up of NAND gates 26 and 28 the outputs of which are fed to the input of NAND gate 30. The output of gate 30 passes through in succession inverters 32 and 34 before reaching extra row line 44. NAND gates 26 and 28 are each provided with an enable input line KILLT and KILLB, respectively.

With input signals on signal line [D, E, F] of gate 14, in a special function test mode a special sensing circuit not shown becomes activated and sends out an enabling KILLT signal to the KILLT input signal line of NAND gate 26 and to the $\overline{\text{KILLT}}$ signal input line of gate 14 to disable the latter. (Once the unit is taken out of a test mode a signal $\overline{\text{KILLT}}$ is provided to gate 14 to enable it for use by an end user.) As a result row 38 will not be selected but the extra row 44 will be selected instead. This permits access to the extra row 44 to allow it to be programmed and thus verify that the programming circuitry on the chip is functional. The cells in the extra row are programmed so that they are in a non-conductive or "0" state. Once so programmed a speed test can be performed between the non-conducting cells in the extra row 44 and the conducting cells in all of the other rows except for row 38. The case of moving from a non-conducting to a conducting cell is the one for which access time is the slowest. Also, the operation of each cell in the array other than for those in rows 38 and 44 can be tested.

In order to allow row 38 to be tested a second gate 18 having input lines [G, H, I] is selected for installation of a fourth input signal line $\overline{\text{KILLB}}$. In addition, a NAND gate 28 having input signal lines [G, H, I, KILLB] is placed in parallel with NAND gate 26 on a second input line of NAND gate 30. The sensing circuit on the arrival of input signals on signal line [GHI] of gate 18 while in a special function test mode sends out an enabling KILLB signal to the KILLB input signal line of NAND gate 28 and to the $\overline{\text{KILLB}}$ signal input line of gate 18 to disable the latter. As a result row 40 will not be selected but extra row 44 will be instead. Thus testing of the cells on row 38 can be accomplished using KILLB signals rather than KILLT signals while testing of the cells in row 40 is accomplished with KILLT signals as explained above.

There are several methods of entering the special test mode. One such method is to employ logic circuitry coupled to two input pads which is responsive to combinations of higher than normal voltage levels present on those pads to give KILLB, $\overline{\text{KILLB}}$, KILLT and $\overline{\text{KILLT}}$ outputs. FIG. 2 shows a pair of circuits 61 and 63 for carrying out the foregoing functions. Circuits 61 and 63 are identical and like parts in each are designated by like reference numbers. Referring to circuit 61 input line 60 is coupled to gate 68 of parallel connected P-channel transistors 50 whose common source connects to a high voltage level and whose drain connects both to line 72 and to a source of transistor 52 which, in turn, is in series with transistor 54. Input line 62 also connects to gate 70 of transistors 50. Line 72 connects to KILLB output line 74, gate 76 of P-channel transistor 56 and gate 78 of transistor 58. The source of transistor 56 connects to a high voltage source while its drain connects both to the source of transistor 58 as well as to KILLB output line 80.

A high voltage on both inputs 60 and 62 results in both transistors 52 and 54 turning on and transistor 50 being off thereby driving line 72 and hence 74 low. At the same time a low signal on gate 78 turns transistor 58 off and on gate 76 turns transistor 56 on. Thus KILLB line 80 is driven high.

Similarly, a high voltage on input line 60 and a logic "0" or TTL signal on line 62 results in $\overline{\text{KILLB}}$ line 74 going high and KILLB line 80 going low. A high voltage on line 62 and a low on line 60 puts KILLB line 80 low and $\overline{\text{KILLB}}$ line 74 high.

Circuit 63 operates in an identical way. Thus by coupling an INPUT 1 to lines 60 and 64, an INPUT 2 to line 62 and $\overline{\text{INPUT 2}}$ to line 66, for INPUT 1 high and INPUT 2 high one gets KILLB=1, $\overline{\text{KILLB}}$=0, KILLT=0 and $\overline{\text{KILLT}}$=1. For INPUT 1 high and INPUT 2 low one gets KILLB=0, $\overline{\text{KILLB}}$=1, KILLT=1, and $\overline{\text{KILLT}}$=0. Thus a high voltage on lines 60 and 64 and a high on line 62 gives KILLB=1 and $\overline{\text{KILLB}}$=0, otherwise KILLB=0 and $\overline{\text{KILLB}}$=1. Similarly a high voltage on lines 60 and 64 and a low on line 62 gives KILLT=1 and $\overline{\text{KILLT}}$=0, otherwise KILLT=0.

By utilizing the special function test modes and the extra row 44 it is possible to eliminate the need to erase EPROMS due to the requirement of having to program a pattern into the cells in order to test speed and functionality. EPROMS utilizing the present invention can now be packaged without light transmitting windows and, as a result, can be produced with packaging that is much less expensive than that previously used.

It will be observed from FIG. 1 that there are only two extra gate delays (30 and 32) added to the signal path for speed access checks. Thus the extra row gives an accurate estimate of a normal speed path.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed:

1. A method of testing a programmable read only memory comprised of an array of memory cells arranged in rows and columns, where said rows each are enabled by a row gate providing a row selection signal in response to said row gate receiving the address signal corresponding to its associated row, said memory further comprising an extra row of said memory cells enabled by an extra row gate receiving an extra row enable signal in conjunction with the address signal corresponding to a first one of said rows in said array, said method comprising:

disabling the row gate associated with said first row from providing its selection signal in response to the arrival of an address signal corresponding to said first row;

generating said extra row enable signal so that said extra row gate selects said extra row in response to the arrival of said address signal corresponding to said first row;

programming a memory cell in said extra row;

accessing the programmed memory cell of said extra row to verify its programmed state;

after said step of accessing a programmed memory cell in said extra row, enabling the row gate associated with said first row to provide its selection signal in response to the arrival of said address signal corresponding to said first row; and accessing a memory cell in said first row.

2. A method according to claim 1, wherein said disabling, generating and enabling steps are carried out by NAND gate decoders of said first row and of said extra row, wherein said method further comprises, prior to sensing said address signal corresponding to said first row, generating an inhibit signal to an input line of said first row NAND gate decoder and said extra row enable signal to an input line of said extra row NAND gate decoder.

3. A method of testing a programmable read only memory comprised of an array of memory cells arranged in rows and columns, where said rows each are enabled by a row gate providing a row selection signal in response to said row gate receiving the address signal corresponding to its associated row, said memory further comprising an extra row of said memory cells enabled by either of a first extra row gate receiving a first extra row enable signal in conjunction with the address signal corresponding to a first row in said array, or a second extra row gate receiving a second extra row enable signal in conjunction with the address signal corresponding to a second row in said array, said method comprising:

disabling one of said first or said second row gates from providing its selection signal;

generating said first or said second extra row signal so that a selected one of said first or second extra row gates selects said extra row in response to the arrival of the address signal corresponding to said first or second rows, respectively;

programming a memory cell in said extra row;

accessing the programmed memory cell in said extra row to verify its programmed state;

after said step of accessing a programmed memory cell in said extra row, enabling the one of said first or second row gates corresponding to the selected one of said first or second extra row gates to provide its selection signal in response to the arrival of said address signal corresponding to its associated row; and accessing a memory cell in the row associated with the enabled one of said first or second row gates.

4. An improved programmable read only semiconductor memory having an array of memory cells arranged in rows and columns with each row selected by a row gate which generates a row selection signal in response to a predetermined address signal received by said gate, wherein the improvement comprises:

an extra row of said memory cells;

an extra row gate connected to said extra row, for enabling said extra row in response to receiving the address signal corresponding to a first one of said rows in said array and a first extra row enable signal; and means, connected to said extra row gate, for generating the first extra row enable signal in response to a first external mode control signal being at a first logic state, and for generating a first row enable signal in response to said first external mode control signal making a transition from said first logic state to a second logic state;

wherein the row gate corresponding to said first one of said rows is connected to said generating means so that it enables its corresponding row responsive to receiving the address signal corresponding thereto and said first row enable signal.

5. The improved memory of claim 4, wherein said generating means also generates a second extra row enable signal in response to a second external mode control signal being at a first logic state, and for generating a second row enable signal in response to said second external mode control signal making a transition from said first logic state to a second logic state;

wherein said extra row gate also enables said extra row in response to receiving the address signal corresponding to a second one of said rows in said array and said second extra row enable signal;

and wherein the row gate corresponding to said second one of said rows is connected to said generating means so that it enables its corresponding row responsive to receiving the address signal corresponding to said row and said second row enable signal.

6. The improved memory of claim 5, wherein said extra row gate comprises:

a first NAND gate having inputs for receiving the corresponding address signal of said first row and said first extra row enable signal;

a second NAND gate having inputs for receiving the corresponding address signal of said second row and said second extra row enable signal; and a third NAND gate receiving at its inputs the outputs of each of said first and second NAND gates, the output of said third NAND gate connected to said extra row so that said extra row is selected responsive to said extra row gate receiving either said first extra row enable signal in conjunction with the address signal corresponding to said first row, or said second extra row enable signal in conjunction with the address signal corresponding to said second row.

7. The improved memory of claim 6, wherein two inverter drivers are connected in series between the output of said third NAND gate and said extra row.

8. The improved memory of claim 6, wherein said generating means generates said first and second extra row enable signals responsive to predetermined combinations of voltage levels on a selected pair of input pads, said first and second extra row enable signals being mutually exclusive of one another.

9. The improved memory of claim 5, wherein said row gates comprise a NAND gate followed by an inverter.

10. The improved memory of claim 4, wherein said generating means generates said first extra row enable signal responsive to a predetermined high voltage level on an input pad.

* * * * *